United States Patent [19]
Sali et al.

[11] Patent Number: 5,724,290
[45] Date of Patent: Mar. 3, 1998

[54] METHOD AND PROGRAMMING DEVICE FOR DETECTING AN ERROR IN A MEMORY

[75] Inventors: Mauro Sali, S. Angelo Lodigiano; Marcello Cane, Piobesi D'Alba; Corrado Villa, Sovico, all of Italy

[73] Assignee: SGS-Thomson Microelectronics S. r. L., Agrate Brianza, Italy

[21] Appl. No.: 774,110

[22] Filed: Dec. 24, 1996

[30] Foreign Application Priority Data

Dec. 29, 1995 [EP] European Pat. Off. ............. 95830555

[51] Int. Cl.⁶ ................................................. G11C 13/00
[52] U.S. Cl. ............................ 365/201; 365/210; 365/200
[58] Field of Search ............................ 365/200, 189.01, 365/189.04, 230.01, 201, 207, 210

[56] References Cited

U.S. PATENT DOCUMENTS 4,763,305  8/1988  Kuo ................................. 365/200
4,811,294  3/1989  Kobayashi et al. ............... 365/189
5,287,326  2/1994  Hirata .......................... 365/230.03

*Primary Examiner*—Terrell W. Fears
*Attorney, Agent, or Firm*—Allen, Dyer, Doppelt, Milbrath & Gilchrist, P.A.

[57] ABSTRACT

The invention relates to a programming method and device for detecting an error and inhibiting writing into a memory. The invention provides for the inclusion, in the standard programming method, of a checking step for interrupting the programming procedure and generating an error signal detecting the attempted overwriting of a "0" with a "1". The checking step of the inventive programming method provides for an initial comparison between the contents of a plurality of bits being programmed and a corresponding plurality of bits to be written in, the generation of an error signal upon detection of homolog pairs with a value of "one", and the interruption of the byte programming procedure to prevent a "1" from being written over a "0".

13 Claims, 2 Drawing Sheets

METHOD AND PROGRAMMING DEVICE FOR DETECTING AN ERROR IN A MEMORY

FIELD OF THE INVENTION

The present invention relates to a programming method for detecting an error and inhibiting writing into a memory. Specifically, the invention relates to a programming method wherein a plurality of digital signals corresponding to the bits of a byte being programmed are first compared with a second plurality of digital signals corresponding to data to be written in, and the programming procedure is then applied to the homolog bits carrying null values. The invention also concerns a device for programming a byte or memory word comprising a plurality of bits, the device having a plurality of first and second input terminals, an additional input terminal, an output terminal, and a bit comparator. More particularly, but not exclusively, the invention relates to a memory of the EEPROM flash type, and reference will be made in the description to this field for convenience of illustration.

BACKGROUND OF THE INVENTION

As is well known, when programming a programmable electrically erasable non-volatile memory, in particular a memory of the EEPROM flash type, a software engineer may have to write the same memory word, i.e. the same byte, for a number of times. Programming is the operation whereby "0s" only, not "1s", are written into a given byte, the conversion of a "0" to a "1" involving instead an erase operation. However, during each byte programming sequence, a value of "1" may have to be added or shifted into the bit plurality forming the byte. But to do so, the user should utilize the erase algorithm. On the other hand, stored at the programming stage are a first value corresponding to the contents of the byte being programmed and a second value corresponding to the data that the user wants to have written in. Of course, the number of bits in the data to be written should be equal to the number of bits which comprise the byte.

The programming methods proposed by prior art solutions basically provide for the execution of a program algorithm which comprises the following sequential steps: 1. reading the byte contents that corresponds to a selected memory location; 2. storing the contents of the read byte into a first buffer register; 3. storing the value of the data that the user wants to write in into a second buffer register; 4. comparing the contents, bit for bit, of the first buffer register with that of the second buffer register; and 5. programming those bits which correspond to pairs of null values occupying the same positions in the byte.

If there are no bits for programming, the sequence is terminated.

As previously mentioned, there exists a need for preventing, during the programming sequence, a value of "0" of the selected byte from being overwritten with a value of "1". In fact, after initiating the internal program algorithm by appropriate instructions, the system may not be requested to perform any further checks; and yet, it is desirable that the user be informed of that the writing of a "1" over a bit of "0" value has been requested.

The underlying technical problem of this invention is to provide a programming method whereby any attempts at writing a value of "1" over a value of "0" in the course of a memory programming procedure can be detected and inhibited.

SUMMARY OF THE INVENTION

The solution provided by the invention includes introducing, in a standard programming method, a checking step to interrupt the programming procedure itself and generate an error signal effective to reveal the attempted writing of a "1" over a "0". In particular, the checking step of the inventive programming method provides for: an initial comparison of the contents of a plurality of bits being programmed with a corresponding plurality of bits to be written in, the generation of an error signal upon homolog pairs of "1" value being detected, and the interruption of the byte programming procedure itself to avoid a "1" being written over a "0". Advantageously, according to the invention, the programming procedure for bits that correspond to pairs with null values is interleaved to the checking step, between the first stage of generating the error signal and the second stage of interrupting the programming procedure, such that the interruption can only take place after the null bits have been programmed. In particular, the method of this invention applies to a byte or memory word, understood as the basic storage unit.

The programming device of this invention comprises a plurality of first and second input terminals and a byte comparator which is connected between an internal node, a voltage reference, and the plurality of first and second input terminals, and a logic circuit placed between the internal node and an output terminal to generate an error signal on a pair of values of "one" being detected by the comparator. Advantageously, according to the invention, the first and second input terminals receive digital signals which correspond to the plurality of bits being programmed and the data to be written in, respectively; and the comparator performs a bit-for-bit comparison on such digital signals and outputs an error signal upon the occurrence of bit pairs with a value of "one" being detected. For this purpose, the byte comparator comprises a plurality of equality detectors connected between the internal node and the first voltage reference, as well as to the first and second input terminals. The equality detectors comprise first and second transistors which are connected in series with each other between the internal node and the second voltage reference and have their control gate terminals connected to corresponding pairs of the first and second input terminals.

Furthermore, the logic circuit comprises a flip-flop and at least one decoupling logic gate connected in series with each other between the internal circuit node and the output terminal of the programming device, all these components being effective to hold the output signal constant during the programming of bits that correspond to null value pairs. Advantageously, according with the invention, the flip-flop and decoupling logic gate are input respective enable signals. In addition, the programming device of this invention is driven by means of an enable signal from an enable circuit, which circuit includes a further enable logic gate controlled by means of an enable signal and a control signal.

In a preferred embodiment, the flip-flop comprises a plurality of enable transistors connected to the input terminals of the first flip-flop and to a switch, which transistors are placed between the first and the second voltage references. In particular, the switch comprises first and second switching transistors, in series with each other, and is connected to the output terminal of the flip-flop through a logic inverter.

The features and advantages of a programming method and device according to the invention will be apparent from the following detailed description of an embodiment thereof, given by way of example and not of limitation with reference to the accompanying drawings.

DETAILED DESCRIPTION OF THE PREFERRED EMBODIMENT

The example will be discussed, just as it has been for the background art hereinabove, of a byte BY being programmed inside a memory FM. The byte BY comprises a plurality of bits BY<i>, and its contents are stored as a first value V1<i>, while a second value V2<i> corresponds to a data DA that the user means to have written in, i.e. to a plurality of bits making up the data DA. Here again, the number of bits which comprise the data DA must, of course, be equal to the number of bits which make up the byte BY. In particular, in this embodiment of the invention, a byte BY and a data DA each comprised of eight bits are considered.

A programming method according to the invention differs from prior solutions in that it includes a checking step, in turn divided into the following substeps of: a) generating an error signal ERR, made available for the user upon pairs of values V1<i> and V2<i> equal to "one" being detected; and b) interrupting a programming procedure for the byte BY. Advantageously, according to the invention, the programming procedure, for programming those bits which correspond to null pairs of values V1<i> and V2<i>, is included in the checking step between the substep a) of generating the error signal and the substep b) of interrupting the programming procedure. Thus, the programming method of this invention allows programming of a memory byte BY, but provides an indication of any attempt at writing a value of "1" over a value of and only interrupts the programming procedure after the null bits are programmed.

Figure 1:
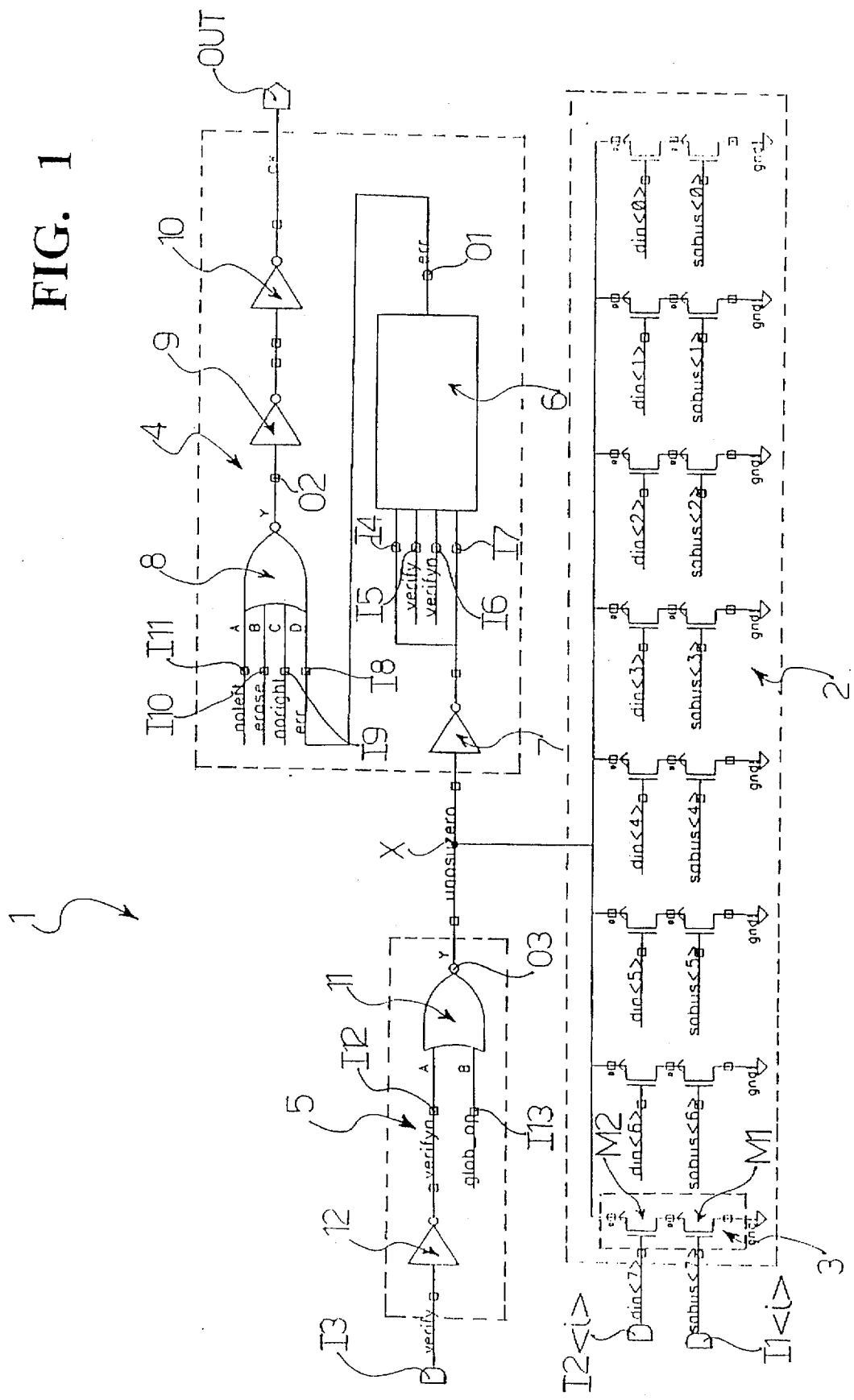
FIG. 1 shows a programming device according to the invention.

Referring to FIG. 1, generally shown at 1 is a programming device according to the invention. The device 1 comprises a bit comparator 2 connected between an internal circuit node X and a first voltage reference, specifically a ground reference GND. The bit comparator 2 comprises a plurality of equality detectors 3, being connected between the node X and the ground GND and connected to first I1<i> plurality of input terminals and a second I2<i> plurality of input terminals. In particular, the first input terminals I1<i> receive digital signals V1<i> which correspond to the contents of the byte BY being programmed, while the second input terminals I2<i> receive digital signals V2<i> which correspond to the data DA to be written in.

In a preferred embodiment of the programming device according to the invention, the input terminals I1<i> and terminals I2<i> are connected to a first and a second buffer register, not shown in the Figure. Each equality detector 3 comprises a first transistor M1 and a second M2 transistor, specifically of the N-channel MOS type, which are connected in series with each other between the circuit node X and the ground GND and have their control gate terminals connected to corresponding pairs of the input terminals I1<i> and I2<i>.

The internal circuit node X is connected to an output terminal OUT of the programming device 1 through a logic circuit 4, and to a third input or enable terminal I3 through an enable circuit 5. The output terminal OUT supplies a signal OK which is made available externally for the user. The logic circuit 4 comprises a flip-flop 6 having a first input terminal I4, a second input terminal I5, a third input terminal I6 and a fourth I7 input terminal and an output terminal O1, the first input terminal I4 and fourth input terminal I7 being connected, through an inverting decoupler 7, to the internal circuit node X, and the second input terminal I5 and third input terminal I6 receiving an enable signal VERIFY and a negated enable signal VERIFYN, respectively. The enable signal VERIFY also appears on the third input terminal I3 of the programming device 1.

The output terminal O1 of the flip-flop 6 supplies the error signal ERR detecting the attempted writing of a "1" over a "0", and is connected to a first input terminal I8 of a decoupling logic gate 8. The decoupling logic gate also has a second input terminal I9, a third input terminal I10 and a fourth input terminal I11, arranged to respectively receive a first NORIGHT, a second ERASE and a third NOLEFT enable signal, and an output terminal O2 connected, in turn, to the output terminal OUT of the programming device 1 through a first logic inverter 9 and a second 10 logic inverter.

The enable circuit 5 includes a further enable logic gate 11 having an output terminal O3 connected to the internal circuit node X, and a first input terminal I12 and a second input terminal I13 arranged to respectively receive the enable signal VERIFY, via a logic inverter 12, and a control signal GLOB_OP.

Figure 2:
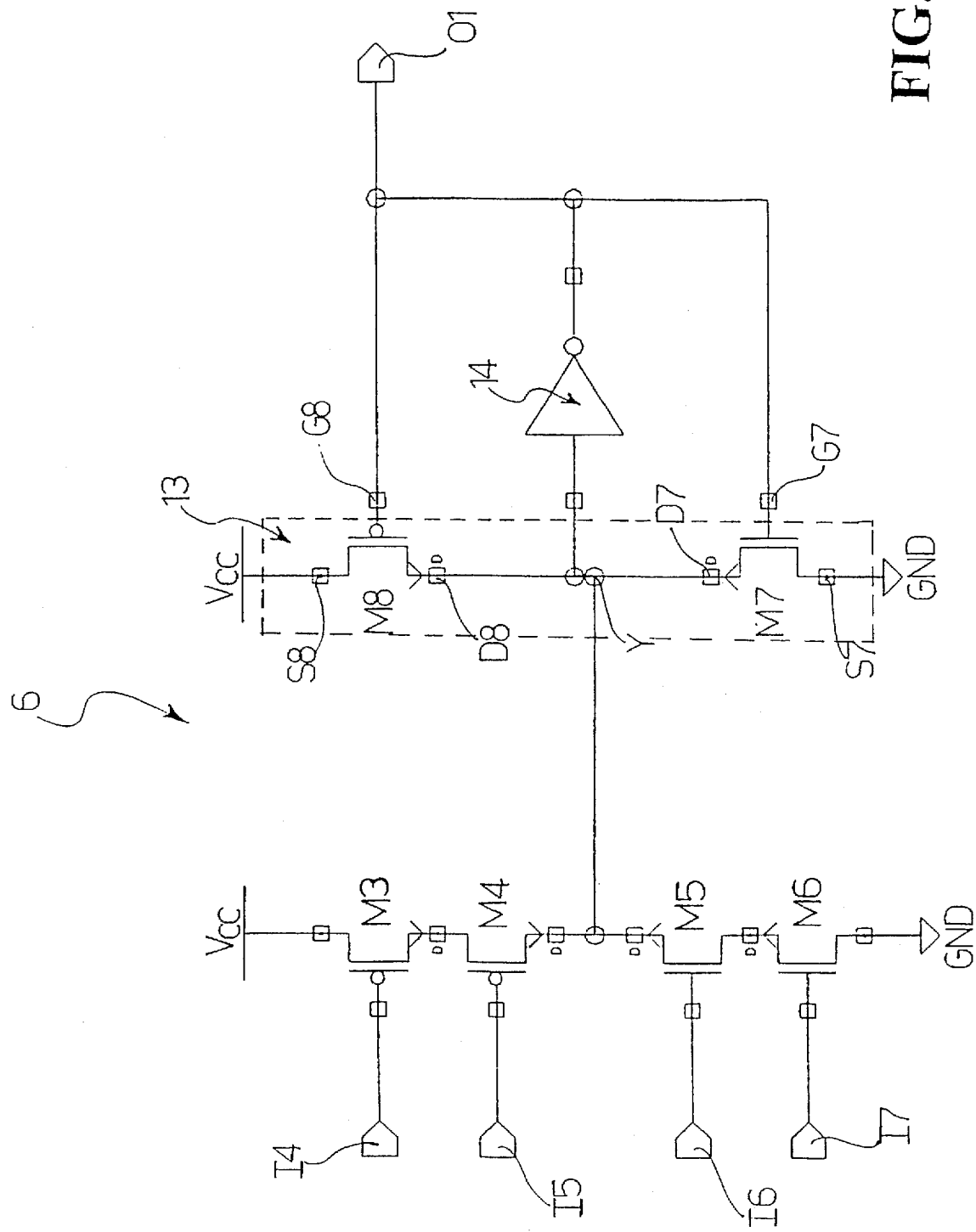
FIG. 2 is a detail view of the programming device shown in FIG. 1.

FIG. 2 shows in greater detail the flip-flop 6, as comprised of a first enable transistor M3, a second enable transistor M4, a third enable transistor M5 and a fourth enable transistor M6 connected in series with one another between a supply voltage reference Vcc and ground GND. In particular, in the embodiment of FIG. 2, the first enable transistor M3 and the second enable transistors M4 are P-channel MOS transistors, whereas the third enable transistor M5 and fourth enable transistor M6 are N-channel MOS transistors.

The control gate terminals of the enable transistors M1, M2, M3 and M4, respectively form the input terminals I4, I5, I6 and I7 of the flip-flop 6. Furthermore, the drain terminals of the second and third enable transistors M4, M5 are connected to an internal circuit node Y. The flip-flop 6 further comprises a switch 13 connected between the supply voltage reference Vcc and ground GND. The switch 13, in turn, consists of a first switching transistor M7 and a second switching transistor M8, in series with each other.

In particular, the first switching transistor M7 is a P-channel MOS transistor having its source terminal S7 connected to ground GND, whereas the second switching transistor M8 is an N-channel MOS transistor having its source terminal S8 connected to the supply voltage reference Vcc. The drain terminals D7 and D8 of the first and second switching transistors, M7 and M8, are connected together to form the internal circuit node Y, while their gate terminals G7 and G8 are connected to the output terminal O1 of the flip-flop 6. The internal circuit node Y is, in turn, connected to the output terminal O1 of the flip-flop 6 by the intermediary of a logic inverter 14.

During a read operation of the byte BY being programmed, the enable signal VERIFY has a value of "1" and biases the internal circuit node Y to the same value as the supply voltage Vcc. During a subsequent programming operation for the byte BY, the node X will be held at a value equal to Vcc by means of the control signal GLOB_OP, whose value is "0"; however, it will be brought to a value equal to the ground GND on the appearance of a pair of null signals I1<i> and I2<i> on the control gates of the transistors M1 and M2 of at least one equality detector 3.

A changeover of the internal circuit node X will cause the output terminal O1 of the flip-flop 6 to also change over; the error signal ERR acquires a value of "1" and holds at this value of "1" the output terminal OUT of the programming device 1 as well, through the decoupling logic gate 8 and the series of the logic inverters 9 and 10. The output signal OK on the output terminal OUT is brought to and held at a value of "1", thereby detecting that an error has been found in the comparison of the value V1<i>, corresponding to the data present in the byte BY being programmed, with the value V2<i>, corresponding to the data DA to be written in. The programming device 1 will exit the programming procedure after issuing the maximum number of programming pulses.

In conclusion, the programming device 1 of this invention allows the programming procedure for a byte BY to be interrupted whenever it is detected that the values V1<i> and V2<i>, i.e. the values of the byte BY being programmed and of the data DA to be written in, are identical, while also reporting externally the error to the user.

I claim:

1. A method for programming a byte comprising the steps of:

comparing a plurality of digital signals which correspond to the bits in the byte being programmed and a second plurality of digital signals which correspond to data to be written in;

programming homolog bit pairs with null values; and checking the programming by generating an error signal on the occurrence of homolog bit pairs having a value of "one", and interrupting the programming to prevent a value of "zero" from being overwritten with a value of "one".

2. A programming method according to claim 1, wherein the programming step is carried out between the step of generating the error signal and the step of interrupting the programming.

3. A programming device for programming a byte comprising a plurality of bits, said device comprising:

a plurality of first and second input terminals, an additional input terminal and an output terminal; and a bit comparator connected between an internal circuit node and a first voltage reference as well as to said first and second input terminals, said bit comparator comprising a logic circuit connected between the internal circuit node and the output terminal.

4. A programming device according to claim 3, wherein said first input terminals receive digital signals which correspond to the bits being programmed, and said second input terminals receive digital signals which correspond to data to be written in; and wherein said output terminal supplies an error signal based upon said bit comparator detecting homolog bit pairs with a value of "one".

5. A programming device according to claim 4, further comprising means for making the error signal available external to the device.

6. A programming device according to claim 3, wherein said bit comparator comprises a plurality of equality detectors connected between the internal circuit node and the first voltage reference and to said first and second input terminals.

7. A programming device according to claim 6, wherein each of said equality detectors comprises first and second transistors being connected in series with each other and between the internal circuit node and the first voltage reference; and wherein gate control terminals of said first and second transistors are connected to corresponding pairs of said first and second input terminals.

8. A programming device according to claim 3, wherein said logic circuit comprises a flip-flop and at least one decoupling logic gate connected in series with each other between the internal circuit node and the output terminal.

9. A programming device for programming a byte comprising a plurality of bits, said device comprising:

a plurality of first and second input terminals, an additional input terminal and an output terminal, said first input terminals receiving digital signals which correspond to the bits being programmed, and said second input terminals receiving digital signals which correspond to data to be written in; and a bit comparator connected between an internal circuit node and a first voltage reference as well as to said first and second input terminals, said bit comparator comprising a logic circuit connected between the internal circuit node and the output terminal so that the output terminal supplies an error signal based upon detecting homolog bit pairs with a value of "one".

10. A programming device according to claim 9, further comprising means for making the error signal available external to the device.

11. A programming device according to claim 9, wherein said bit comparator comprises a plurality of equality detectors connected between the internal circuit node and the first voltage reference and to said first and second input terminals.

12. A programming device according to claim 11, wherein each of said equality detectors comprises first and second transistors being connected in series with each other and between the internal circuit node and the first voltage reference; and wherein gate control terminals of said first and second transistors are connected to corresponding pairs of said first and second input terminals.

13. A programming device according to claim 9, wherein said logic circuit comprises a flip-flop and at least one decoupling logic gate connected in series with each other between the internal circuit node and the output terminal.

* * * * *